(12) United States Patent
Ham

(10) Patent No.: US 10,024,935 B2
(45) Date of Patent: Jul. 17, 2018

(54) MRI GRADIENT AMPLIFIER OPERABLE AT DIFFERENT SLEW RATES

(71) Applicant: KONINKLIJKE PHILIPS N.V., Eindhoven (NL)

(72) Inventor: Cornelis Leonardus Gerardus Ham, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 653 days.

(21) Appl. No.: 14/416,075

(22) PCT Filed: Jul. 24, 2013

(86) PCT No.: PCT/IB2013/056050
§ 371 (c)(1),
(2) Date: Jan. 21, 2015

(87) PCT Pub. No.: WO2014/016774
PCT Pub. Date: Jan. 30, 2014

(65) Prior Publication Data
US 2015/0177345 A1    Jun. 25, 2015

Related U.S. Application Data

(60) Provisional application No. 61/675,364, filed on Jul. 25, 2012.

(51) Int. Cl.
*G01R 33/36* (2006.01)
*G01R 33/385* (2006.01)

(52) U.S. Cl.
CPC ..... *G01R 33/3671* (2013.01); *G01R 33/3614* (2013.01); *G01R 33/3852* (2013.01); *G01R 33/3854* (2013.01)

(58) Field of Classification Search
CPC ............ G01R 33/3671; G01R 33/3614; G01R 33/3852; G01R 33/3854
See application file for complete search history.

(56) References Cited

U.S. PATENT DOCUMENTS

| 4,864,479 A | * | 9/1989 | Steigerwald | H02M 3/337 363/132 |
| 5,113,145 A | * | 5/1992 | Ideler | H03F 3/2171 330/207 A |
| 5,646,835 A | | 7/1997 | Katcha | |
| 5,661,445 A | * | 8/1997 | Larson, III | G01R 33/385 324/318 |

(Continued)

FOREIGN PATENT DOCUMENTS

| CN | 102508183 A | 6/2012 |
| JP | 9248287 A | 9/1997 |
| JP | 1080413 A | 3/1998 |

*Primary Examiner* — G. M. Hyder

(57) ABSTRACT

The present invention relates to a method for supplying current to a gradient coil (107,207) of a magnetic resonance imaging system (100) by a gradient amplifier (222), the method comprising: supplying, by an electrical power supply (241), a voltage at first level to the gradient amplifier output to generate a gradient current in the gradient coil (107,207) to produce a magnetic gradient field at an slew rate, wherein the slew rate is set to a first value, resetting the slew rate to a second value, comparing the second value to the first value, and adjusting the voltage to a second level if the second value is different from the first value.

14 Claims, 3 Drawing Sheets

(56) References Cited

U.S. PATENT DOCUMENTS

| | | | |
|---|---|---|---|
| 5,663,647 A * | 9/1997 | Wirth | G01R 33/3852 324/322 |
| 5,999,001 A | 12/1999 | Kuhara et al. | |
| 6,031,746 A * | 2/2000 | Steigerwald | H03F 3/2171 323/225 |
| 6,069,806 A | 5/2000 | Lenz | |
| 6,166,602 A * | 12/2000 | Steigerwald | H03F 3/2178 327/124 |
| 6,198,282 B1 | 3/2001 | Dumoulin | |
| 6,198,289 B1 | 3/2001 | Du | |
| 6,201,395 B1 | 3/2001 | Stanley | |
| 6,323,649 B1 | 11/2001 | Pace et al. | |
| 6,452,391 B1 | 9/2002 | Bernstein | |
| 6,487,099 B1 | 11/2002 | Perkins | |
| 6,687,527 B1 | 2/2004 | Wu et al. | |
| 6,975,698 B2 * | 12/2005 | Katcha | H05G 1/10 378/101 |
| 7,002,815 B2 | 2/2006 | Scarlatescu | |
| 7,054,411 B2 * | 5/2006 | Katcha | H05G 1/10 336/105 |
| 7,116,166 B2 * | 10/2006 | Sabate | G01R 33/3852 330/146 |
| 7,843,708 B2 | 11/2010 | Seong | |
| 8,406,852 B2 | 3/2013 | Weiss | |
| 2001/0010464 A1 | 8/2001 | Takamori | |
| 2011/0074413 A1 | 3/2011 | Venkatesa | |
| 2012/0249145 A1 * | 10/2012 | Lai | G01R 33/3852 324/318 |

* cited by examiner

US 10,024,935 B2

MRI GRADIENT AMPLIFIER OPERABLE AT DIFFERENT SLEW RATES

CROSS-REFERENCE TO PRIOR APPLICATIONS

This application is the U.S. National Phase application under 35 U.S.C. § 371 of International Application No. PCT/IB2013/056050, filed on Jul. 24, 2013, which claims the benefit of U.S. Provisional Patent Application No. 61/675,364, filed on Jul. 25, 2012. These applications are hereby incorporated by reference herein.

TECHNICAL FIELD

The invention relates to magnetic resonance imaging, in particular to power supplies for the magnetic field gradient coils of magnetic resonance imaging systems.

BACKGROUND AND RELATED ART

In Magnetic Resonance Imaging (MRI), gradient amplifiers are typically used to provide current for magnetic field gradient coils to provide spatial encoding of atomic spins located in a magnetic field. These gradient amplifiers are typically characterized by high peak power and high precision of the generated current waveforms.

A significant fraction of MRI scans may only require a slew rate of the generated current waveforms lower than the slew rate initially provided by the MRI system. For those scans, the initial slew rate is reduced.

U.S. Pat. No. 5,646,835 discloses a series resonant converter which a voltage controlled oscillator and phase delay to control the switching (IGBT gating) to respond to changing load demands.

SUMMARY OF THE INVENTION

It is an objective of embodiments of the invention to provide for a method for supplying current to a gradient coil, a magnetic resonance imaging system, a gradient amplifier and a computer-program product. Said objective is solved by the subject matter of the independent claims. Advantageous embodiments are described in the dependent claims.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Aspects of the present invention are described with reference to flowchart illustrations and/or block diagrams of methods, apparatus (systems) and computer program products according to embodiments of the invention. It will be understood that each block or a portion of the blocks of the flowchart, illustrations, and/or block diagrams, can be implemented by computer program instructions in form of computer executable code when applicable. It is further understood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wireline, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, gear sticks, steering wheel, pedals, wired glove, dance pad, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'processor' as used herein encompasses an electronic component which is able to execute a program or machine executable instruction. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. Many programs have their instructions performed by multiple processors that may be within the same computing device or which may even be distributed across multiple computing devices.

Magnetic resonance image data is defined herein as being the recorded measurements of radio frequency signals emitted by atomic spins by the antenna of a Magnetic resonance apparatus during a magnetic resonance imaging scan. A Magnetic Resonance Imaging (MRI) image is defined herein as being the reconstructed two or three dimensional visualization of anatomic data contained within the magnetic resonance imaging data. This visualization can be performed using a computer.

A 'bridge' as used herein encompasses an electric circuit with a voltage supply and four switching elements which are used to connect the voltage supply with the outputs of the bridge circuit. The switching elements allow the polarity of the voltage output by the bridge circuit to be switched.

In one aspect, the invention relates to a magnetic resonance imaging system comprising a gradient coil. The magnetic resonance imaging system further comprises a gradient amplifier for supplying current to the gradient coil. The gradient amplifier output is connected to the gradient coil. The gradient amplifier comprises an electrical power supply to supply a voltage at a first level to the gradient amplifier output to generate a gradient current in the gradient coil to produce a magnetic gradient field at a slew rate. The slew rate is set to a first value.

The gradient amplifier may further comprise a power electronic stack. The power electronic stack comprises a capacitor which is connected in parallel with a bridge switching power stage. The bridge switching power stage may encompass four switching elements which are used to connect the voltage with the gradient amplifier output. The switching elements allow the polarity of the voltage to be switched. The bridge may be, for example, a metal-oxide-semiconductor field-effect transistor (MOSFET) or an insulated gate bipolar transistor (IGBT) bridge.

The magnetic resonance imaging system further comprises a controller coupled to the electrical power supply. The controller is adapted for resetting the slew rate to a second value.

A magnetic field of the gradient coil has in general a time dependence shape following a trapezoidal shape. Accordingly, the current provided by the gradient amplifier to drive gradient coil must have a trapezoidal shape as well. During the flat top portion of the trapezoid i.e. constant current amplitude the gradient amplifier needs to balance ohmic losses in the gradient coil. Those losses require relatively low voltage from the gradient amplifier. During the ramped portions of the trapezoid, the current slews at maximum current amplitude. The inductance of the gradient coil requires an additional voltage (i.e. the voltage at the first level) proportional to the rate of current change. The slew rate, as used herein, refers to the rate of change of current amplitude to reach the maximum amplitude.

The change of the slew rate may be triggered for a variety of reasons. For example, the slew rate at high values may induce high losses in the gradient coil and in the body coil of the Radio Frequency (RF) system. This leads to additional acoustic noises and vibrations. Higher vibration level can lead to reduced reliability and higher probability of spikes.

The controller is further adapted for comparing the second value to the first value, and controlling the electrical power supply to adjust the voltage to a second level if the second value is different from the first value.

Said embodiments may be advantageous as they only provide the required power to produce a desired slew rate. In the event that the voltage is reduced (i.e. second value of slew rate is below the first value of the slew rate) these embodiments may be advantageous as they reduce switching dissipation losses in the bridge circuits, and thus increase the maximum allowed RMS current. That is, those scans that were originally limited by the maximum dissipation in the bridge, e.g. diffusion scans, can now use a higher RMS current. For example, when the voltage from the electrical power supply is set at half a maximum value, the switching loss is half of the original losses value. The total dissipation in the bridge is then reduced by about 25% (assuming that the switching losses and conduction losses contribute equally to the total dissipation). Also, a lower dissipation leads to a lower electricity consumption, and since the gradient amplifier is a major contributor of the total energy consumption, the saving in energy cost is significant. Another advantage being that said embodiments may make use of low cost designs requiring, for example, low rating IGBT bridges. In fact, the amount of silicon of the IGBT bridge may be reduced. According to the above described numbers, the amount of silicon can be reduced by 25%.

According to one embodiment, the resetting happens before data acquisition by the magnetic resonance imaging system. This may be advantageous as it further saves power to acquire data that would otherwise be required during the scan.

According to one embodiment, the resetting happens during data acquisition by the magnetic resonance imaging system. This may be advantageous, because it can solve a problem that may occur during data acquisition and does not need interrupting the acquisition itself.

According to one embodiment, the resetting comprises: determining electrical power dissipated by the gradient coil currently producing the magnetic gradient field; and selecting the second value of the slew rate from one or more predetermined slew rate values, if the dissipated electrical power exceeds a predetermined maximum allowed dissipation value.

The higher dissipation limits the number of slices per second to be acquired by the MRI system. By reducing the slew rate, the patient comfort may be improved and the number of slices that can be acquired in a certain period of time can be increased.

The dissipated electrical power may be calculated by multiplying the square of the current in the gradient coil by the resistance of the winding of the gradient coil.

According to one embodiment, the resetting comprises receiving a signal from a subject being imaged by the magnetic resonance imaging system. The signal is indicative of a physiological parameter of the subject. The signal indicates an efferent response of the subject to the magnetic gradient field, and selecting the second value of the slew rate from one or more predetermined slew rate values.

This may also have the advantage of improving the patient comfort since it cancels any peripheral nerve stimulation that may be triggered by the high slew rate.

According to one embodiment, the resetting comprises receiving a request to reduce the first value of the slew rate from a user of the magnetic resonance imaging system, the request being indicative of the second value.

Usually, the user at the host computer defines a scan. For various scan types and resolution, it is pre-defined to use the slew rate at the maximum allowed for the MRI system. For instance, an EPI scan. However, the user can overrule this and change the slew rate value for various reasons including the ones mentioned above.

According to one embodiment, the first value is a maximum slew rate value allowed for the MRI system. The maximum allowable slew rate (e.g. 200 T/m/s) corresponds to the fastest rate of change versus time that the gradient amplifier output can move.

According to one embodiment, the voltage at second level V2 is determined from the voltage at first level V1 using the equation:

$$V2 = S \times V1, \text{ where } S = \max(SR/SR\max, 0.5)$$

where SR is the second value of the slew rate and SRmax is a maximum slew rate value allowed for the MRI system.

In another aspect, the invention relates to a gradient amplifier for supplying current to a gradient coil of a magnetic resonance imaging system. The gradient amplifier has an output operable for being connected to the gradient coil. The gradient amplifier comprises an electrical power supply to supply a voltage at a first level to the gradient amplifier output to generate a gradient current in the gradient coil to produce a magnetic gradient field at a slew rate. The slew rate is set to a first value. The gradient amplifier further comprises a controller coupled to the electrical power supply. The controller is adapted for resetting the slew rate to a second value, comparing the second value to the first value, and controlling the electrical power supply to adjust the voltage to a second level if the second value is below the first value.

According to one embodiment, the second value is below the first value and the voltage at second level is smaller than the voltage at first level.

According to one embodiment, the first value is a maximum slew rate allowed for the MRI system.

According to one embodiment, the voltage at second level V2 is determined from the voltage at first level V1 using the equation:

$$V2 = S \times V1, \text{ where } S = \max(SR/SR\max, 0.5)$$

where SR is the second value of the slew rate and SRmax is a maximum slew rate allowed for the MRI system.

According to some embodiments, the controller is an add-on module to the electrical power supply and/or the gradient amplifier.

In another aspect, the invention relates to a method for supplying current to a gradient coil of a magnetic resonance imaging system by a gradient amplifier, the method comprising:

supplying, by an electrical power supply, a voltage at first level to the gradient amplifier output to generate a gradient current in the gradient coil to produce a magnetic gradient field at a slew rate, wherein the slew rate is set to a first value, resetting the slew rate to a second value, comparing the second value to the first value, and adjusting the voltage to a second level if the second value is different from the first value.

In another aspect, the invention relates to a computer program product comprising computer executable instructions, wherein execution of instructions effects to perform the method steps of a controller as set forth in the above embodiments.

It is understood that one or more of the aforementioned embodiments of the invention may be combined as long as the combined embodiments are not mutually exclusive.

BRIEF DESCRIPTION OF THE DRAWINGS

In the following, preferred embodiments of the invention will be described in greater detail by way of example only making reference to the drawings in which.

DETAILED DESCRIPTION OF THE EMBODIMENTS

In the following, like numbered elements in these figures are either similar elements or perform an equivalent function. Elements which have been discussed previously will not necessarily be discussed in later figures if the function is equivalent.

Figure 1:
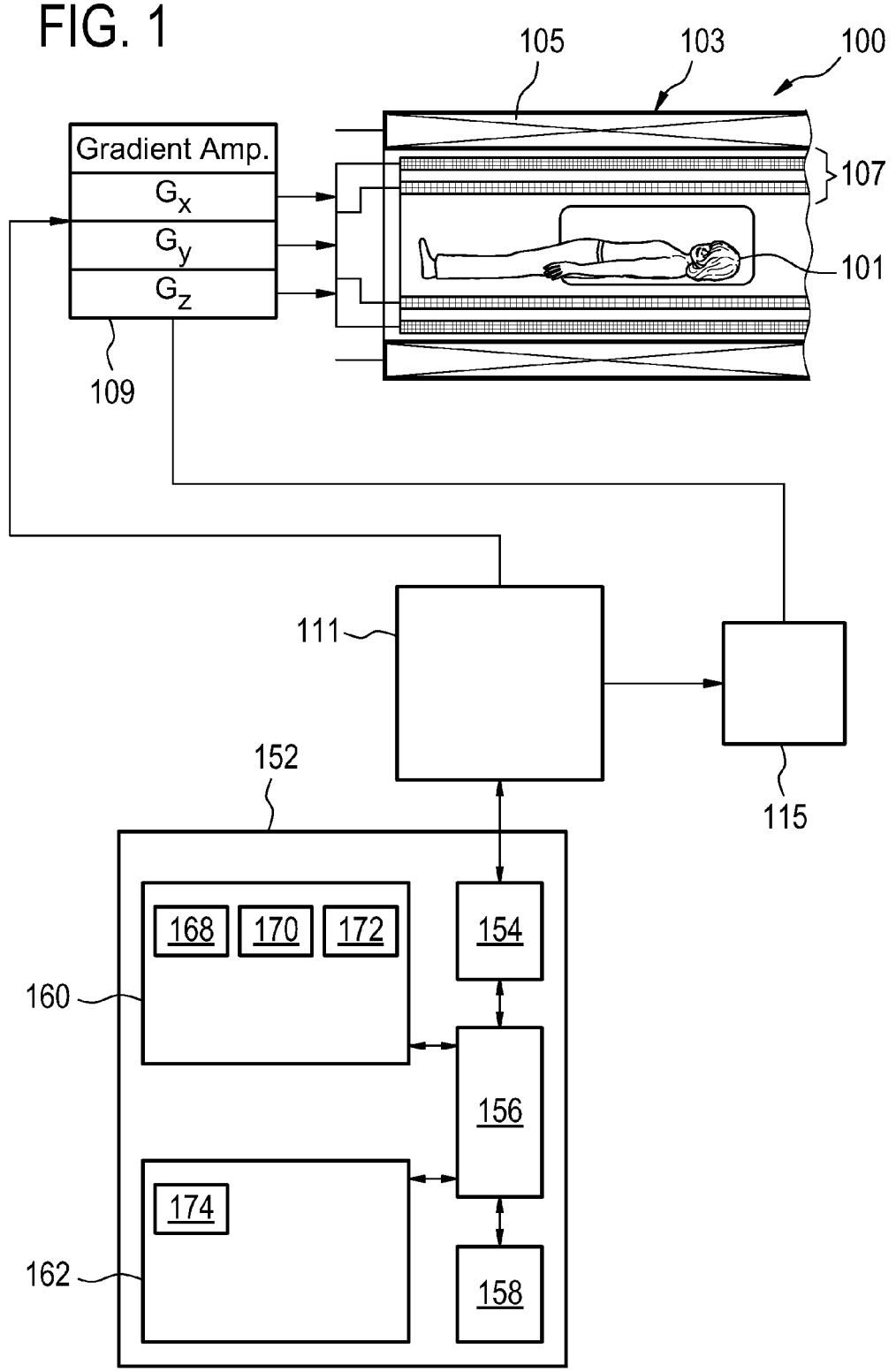
FIG. 1 illustrates a magnetic resonance imaging system.

FIG. 1 illustrates an exemplary magnetic resonance imaging (MRI) system 100 for generating images of a patient 101. MRI system 100 comprises magnetic assembly 103 to generate magnetic fields that will be applied to patient 101. Magnetic assembly 103 comprises magnet coils 105 adapted to produce a static magnetic field required to perform magnetic resonance imaging and gradient coils 107. The gradient coils 107 are made up of an X-axis gradient coil, Y-axis gradient coil, and Z-axis gradient coil. This enables to image different regions of the patient 101.

MRI system 100 further comprises a gradient amplifier unit 109, and a control module 111. The gradient amplifier unit 109 includes an X-axis gradient amplifier Gx, Y-axis gradient amplifier Gy, and Z-axis gradient amplifier Gz. The gradient coil 107 is connected with the gradient amplifier 109. The X-axis gradient coil, Y-axis gradient coil, and Z-axis gradient coil of the gradient coil 107 are connected, respectively, with the Gx amplifier, Gy amplifier and Gz amplifier of the gradient amplifier 109.

A gradient magnetic field in an X-axis direction, gradient magnetic field in a Y-axis direction, and gradient magnetic field in a Z-axis direction are formed, respectively, by electric currents supplied to the X-axis gradient coil, Y-axis gradient coil, and Z-axis gradient coil, respectively, from the Gx amplifier, Gy amplifier and Gz amplifier of the gradient amplifier. Control module 111 is connected with the gradient amplifier 109.

Control module 111 generates control signals for controlling the gradient amplifier. In particular, control module 111 may generate control signals that induce gradient amplifier unit 109 to energize gradient coils 107.

Controller 111 controls the electrical power supply 115. The electrical power supply 115 supplies a voltage for the gradient amplifier 109 to generate a gradient current in the gradient coil 107 to produce a magnetic gradient field.

The controller 111 is shown as being connected to a hardware interface 154 of a computer system 152. The computer system 152 uses a processor 156 to control the magnetic resonance imaging system 100.

The computer system 152 shown in FIG. 1 is illustrative. Multiple processors and computer systems may be used to represent the functionality illustrated by this single computer system 152. The computer system 152 comprises the hardware interface 154 which allows the processor 156 to send and receive messages to components of the MRI system 100. The processor 156 is also connected to a user interface 158, computer storage 160, and computer memory 162.

The computer storage 160 is shown as containing MRI scan parameters 168. One of the scan parameters is the slew rate. The slew rate value may be stored by the controller 113.

The computer storage 160 is further shown as containing a pulse sequence 170.

The pulse sequence 170 either contains instructions or it contains a timeline which may be used in accordance with the scan parameters for constructing instructions which enable the magnetic resonance imaging system 100 to acquire magnetic resonance data 172.

The computer storage 160 is shown as storing magnetic resonance data 172 acquired by the magnetic resonance imaging system 100.

The computer memory 162 is shown as containing a module 174. The module 174 contains computer-executable code which enables the processor 156 to control the operation and function of the MRI system 100. For example the module 174 may use the pulse sequence 170 to acquire the magnetic resonance data 172.

Figure 2:
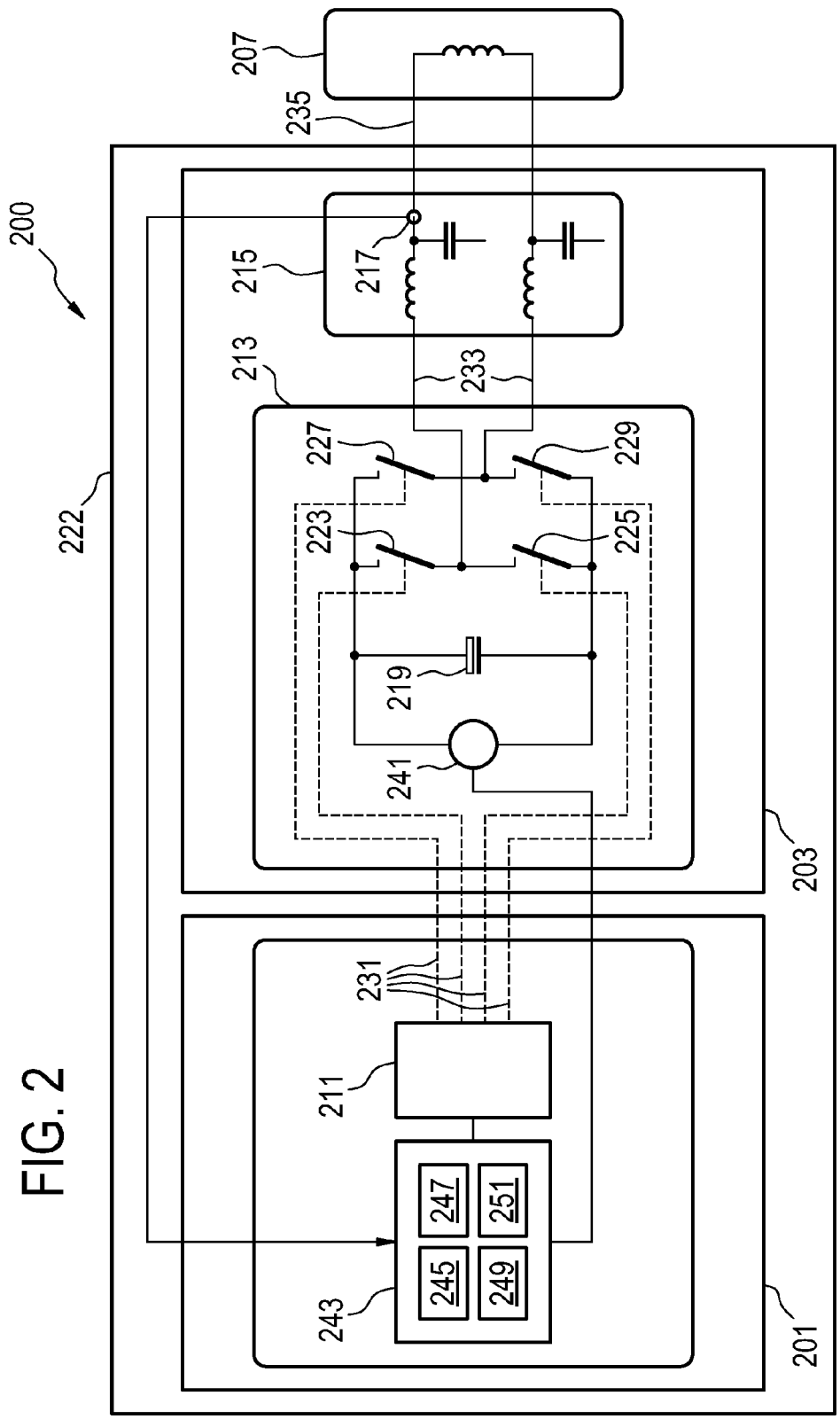
FIG. 2 shows a schematic diagram for a gradient amplifier.

FIG. 2 shows a simplified architecture of an electronic system 200 comprising a gradient amplifier 222 and a gradient coil 207. Gradient amplifier 222 comprises a control module 201, optional, and a power chain 203. The control module 201 generates control signals for the power chain 203 in such a way that a setpoint received digitally from a source, not shown, such as a data acquisition system controller is accurately reproduced at the output of the power chain 203. The power chain 203 converts the main power to high voltage and high current that drive the gradient coil 207.

The control module 201 comprises a controller 243 and a modulator 211. The controller 243 continuously dictates to the modulator 211 the required modulation setpoint in terms of output voltage based on the setpoint, actual and past measured output current and boundary conditions like voltages, damping the output filter, etc.

The modulator 211 converts the modulation setpoint from the digital controller 209 into suitable Pulse Width Modulation (PWM) signals for all individual gate driver units of the power chain 203. These PWM signals are optimized for high voltage bandwidth and high ripple frequency under the condition that the first voltage is within defined limits. The controller 243 is coupled to an electrical power supply 241. The controller 243 may control the electrical power supply 241 to adjust the additional voltage $V_1$ in accordance with a pre-determined slew rate of the gradient current through the gradient coil. For example, the controller 243 may control the electrical power supply 241 to reduce the voltage $V_1$ if the pre-determined slew rate is below the slew rate corresponding to $V_1$. The controller 243 comprises a first unit 245 for resetting the slew rate to a second value, in response to a determination by as second unit 247 that the first slew rate needs to be changed, a third unit 249 for comparing the second slew rate to a predetermined threshold value, and a forth unit 251 for controlling the electrical power supply 241 to adjust the voltage to a second level if the second value is below the first value.

MRI scans that do not benefit from the maximum amplitude/slew rate are limited in maximum level of amplitude/slew rate during the waveform generation on the scan control computer. Those scans can be characterized beforehand, e.g. based on scan technique, echo time, echo spacing, resolution, etc. For those scans the controller 243 selects a lower value as maximum of the system. There are also system related reasons not to use the maximum amplitude and/or slew rate. This may for instance be related to the dissipation in the gradient coil at high frequencies. The usage of high amplitude/slew rate may also increase the probability to induce peripheral nerve stimulation (PNS). The controller 243 has a unit (not shown) to predict PNS and is can limit the maximum amplitude/slew rate to stay within certain PNS limits. The user can also modify the 'recipe' on the host computer to limit the scan. This can be indirectly, e.g. by limiting the system to a lower noise level, using a lower maximum slew rate (SofTone) or directly setting the maximum slew rate in this recipe. In other words, there are multiple opportunities to avoid the maximum slew rate. The maximum slew rate is not very often used.

Figure 3:
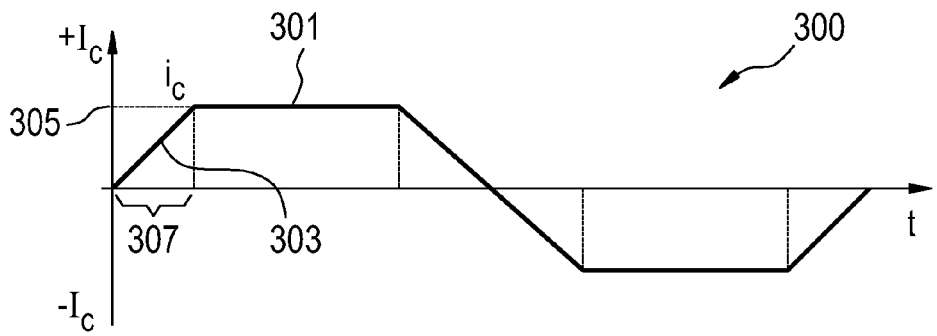
FIG. 3 shows a typical trapezoidal current through the gradient coil.

The power chain 203 consists of a number of blocks that convert the main power to suitable high voltage and high current that drive the gradient coil 207. The power chain 203 comprises a power stack 213. The power stack 213 comprises an electrical power supply 241 that provides the main power. FIG. 3 shows a typical trapezoidal current 300 through the gradient coil 207. During the flat top portion of the trapezoid 301 the gradient amplifier needs to balance ohmic losses in the gradient coil in order to maintain coil current. Those losses require relatively low voltage $V_0$ from the electrical power supply. To generate fast current gradients through the gradient coil 207 during the ramped portions 303 of the trapezoid, a high voltage across its terminals is required. That is, the inductance of the gradient coil 207 requires an additional voltage $V_1$, i.e., the voltage at the first level, proportional to the rate of current change. The slew rate may be defined as the ratio of $i_c$ 305 and $\Delta t$ 307.

The main power is further filtered, rectified and stabilized to a nominal voltage. The power chain 203 comprises a power electronic stack 213, a filter 215 and a current sensor 217. The power electronic stack 213 comprises a capacitor 219 which is connected in parallel with a bridge 221 switching power stage. The bridge 221 may be for example a metal-oxide-semiconductor field-effect transistor (MOSFET) or an insulated gate bipolar transistor (IGBT) bridge. Switches 223 and 225 constitute a first half-bridge, 227 and 229 the second half-bridge. The half-bridges are separately driven by pulse width modulators of the control module 201.

The control module 201 is connected with the four switches 223, 225, 227 and 229 via four respective lines 231. The power stack 213 generates a precise and controlled output stage voltage 233 from the main voltage by pulse-width modulation. A residual ripple is filtered out by the filter 215, and the filtered voltage 235 is across the gradient coil 207 as an output voltage. The filter may be for example a low pass filter.

The sensor 217 may produce a feedback signal to the digital controller 209 indicative of the magnetic gradient field produced for the gradient coil.

For a magnetic resonance imaging system, typically there will be one gradient power supply such the one described in FIG. 2 for each of the three different orthogonal directions.

Figure 4:
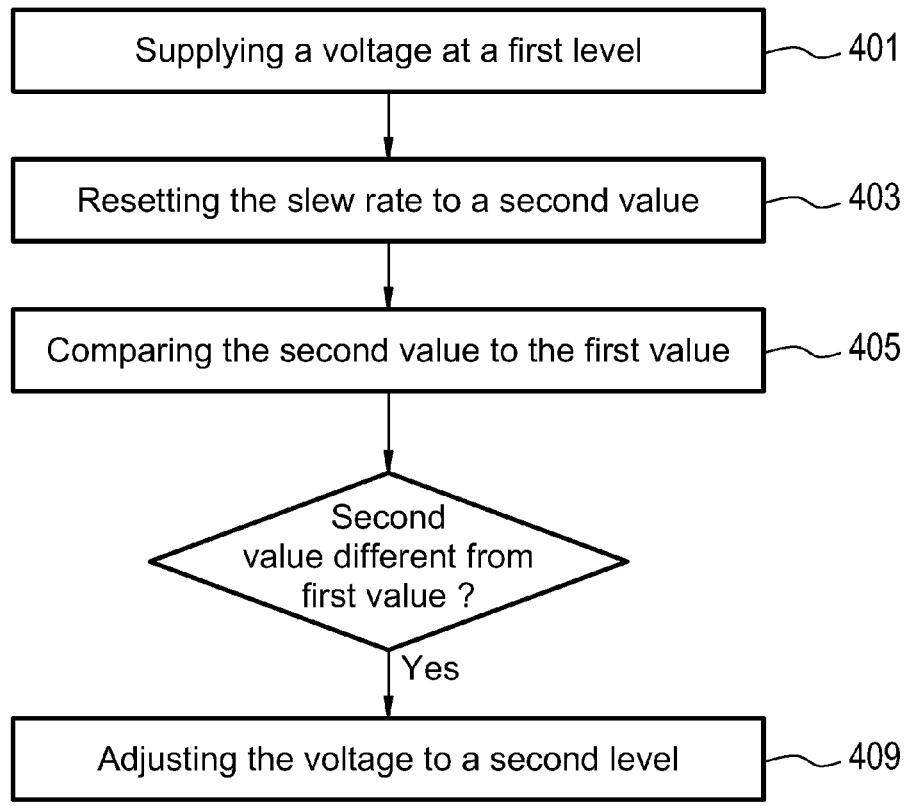
FIG. 4 shows a flowchart of a method for supplying current to a gradient coil of a magnetic resonance imaging system by a gradient amplifier.

FIG. 4 is a flowchart of a method for supplying current to a gradient coil of a magnetic resonance imaging system by a gradient amplifier.

In step 401, the electrical power supply supplies a voltage at first level to the gradient amplifier output to generate a gradient current in the gradient coil to produce a magnetic gradient field at a slew rate. The slew rate is set to a first value.

In step 403, the controller 243 resets the slew rate to a second value, in response to the determination that the first slew rate needs to be changed. The resetting happens before or during data acquisition by the magnetic resonance imaging system. The change of the slew rate value may be driven by dissipation in the gradient coil caused and/or the power stacks. The determination that the first slew rate needs to be changed comprises determining electrical power dissipated by the gradient coil currently producing the magnetic gradient field; and selecting the second slew rate from one or more predetermined slew rates, if the dissipated electrical power exceeds a predetermined maximum allowed dissipation value.

In another example, the determination that the first slew rate needs to be changed comprises receiving a request to reduce the first slew rate from a user of the magnetic resonance imaging system, the request being indicative of the second slew rate.

In step 405, the second value is compared to the first value. The value is a maximum allowable slew rate. The voltage at second level $V_2$ may be determined from the voltage at first level $V_1$ using the equation:

$$V_2 = S \times V_1, \text{ where } S = \max(SR/SR\max, 0.5)$$

where SR is the second value of the slew rate and SRmax is a maximum allowable slew rate.

In step 409, the voltage is adjusted to a second level if the second value is different from the first value.

LIST OF REFERENCE NUMERALS

100 MRI system
101 patient
103 magnetic assembly
105 magnet coil
107 gradient coil
109 gradient amplifier
111 control module
113 controller
115 electrical power supply
152 computer system
154 hardware interface
156 processor
158 user interface
160 computer storage
162 computer memory
168 scan parameters
170 pulse sequence
172 magnetic resonance data
174 module
200 electronic system
222 gradient amplifier
201 control module
203 power chain
207 gradient coil
209 digital controller
211 modulator
213 power stack
215 filter
217 sensor
219 capacitor
223-229 switches
231 line
233 output voltage
235 filtered voltage
241 electrical power supply
243 controller
300 current
301 trapezoid
303 ramped portions
305 $i_c$
307 $\Delta t$

The invention claimed is:

1. A magnetic resonance imaging system comprising:
a gradient coil,
a gradient amplifier for supplying current to the gradient coil, the gradient amplifier output being connected to the gradient coil, the gradient amplifier comprising:
a control module with a digital controller and a modulator to provide pulse width modulation (PWM) signals
a power chain with a power electronic stack and a filter to supply a filtered voltage across the gradient coil wherein the power electronic stack is provided with an electrical power supply and a capacitor arranged in parallel with a bridge switching power stage,
wherein the electrical power supply is configured to supply a voltage at a first level over the bridge switching power stage to apply the filtered output voltage across the gradient coil to generate a gradient current in the gradient coil to produce a magnetic gradient field at a slew rate, wherein the slew rate is set to a first value; and
a controller coupled to the electrical power supply, wherein the digital controller is adapted for resetting the slew rate to a second value including determining electrical power dissipated by the gradient coil currently producing the magnetic gradient field by multiplying the square of the current in the gradient coil by the resistance of the winding of the gradient coil and selecting the second value of the slew rate from one or more predetermined slew rate values if the dissipated electrical power exceeds a predetermined maximum allowed dissipation value, comparing the second value to the first value, and controlling the electrical power supply to adjust the voltage over bridge switching power stage to a second level if the second value is different from the first value.

2. The magnetic resonance imaging system of claim 1, wherein the resetting happens before data acquisition by the magnetic resonance imaging system.

3. The magnetic resonance imaging system of claim 1, wherein the resetting happens during data acquisition by the magnetic resonance imaging system.

4. The magnetic resonance imaging system of claim 1, wherein the first value is a maximum slew rate value allowed for the MRI system.

5. The magnetic resonance imaging system of claim 1, wherein the voltage at second level $V_2$ is determined from the voltage at first level $V_1$ using the equation:

$$V_2 = S \times V_1, \text{ where } S = \max(SR/SR_{max}, 0.5)$$

where SR is the second value of the slew rate and $SR_{max}$ is a maximum slew rate value allowed for the MRI system.

6. A computer program product comprising computer executable instructions, wherein execution of instructions effects to perform the method steps of a control module as set forth in claim 1.

7. The magnetic resonance imaging system of claim 1, wherein the second value is below the first value and the voltage at second level is smaller than the voltage at first level.

8. A gradient amplifier for supplying current to a gradient coil of a magnetic resonance imaging system, the gradient amplifier having an output operable for being connected to the gradient coil, the gradient amplifier comprising:

a control module with a digital controller and a modulator to provide pulse width modulation (PWM) signals a power chain with a power electronic stack and a alter to supply a filtered voltage across the gradient coil wherein the power electronic stack is provided with an electrical power supply and a capacitor arranged in parallel with a bridge switching power stage, wherein the electrical power supply is configured to supply a voltage at a first level over the bridge switching power stage to apply the filtered output voltage across the gradient coil to generate a gradient current in the gradient coil to produce a magnetic gradient field at a slew rate, wherein the slew rate is set to a first value;

a controller coupled to the electrical power supply being adapted for resetting the slew rate to a second value including determining electrical power dissipated by the gradient coil currently producing the magnetic gradient field by multiplying the square of the current in the gradient coil by the resistance of the winding of the gradient coil and selecting the second value of the slew rate from one or more predetermined slew rate values if the dissipated electrical power exceeds a predetermined maximum allowed dissipation value, comparing the second value to the first value, and controlling the electrical power supply to adjust the voltage over the bridge switching power stage to a second level if the second value is different from the first value.

9. The gradient amplifier of claim 8, wherein the second value is below the first value and the voltage at second level is smaller than the voltage at first level.

10. The gradient amplifier of claim 8, wherein the first value is a maximum slew rate allowed for the MM system.

11. The gradient amplifier of claim 8, wherein the voltage at second level $V_2$ is determined from the voltage at first level $V_1$ using the equation:

$$V_2 = S \times V_1, \text{ where } S = \max(SR/SR_{max}, 0.5)$$

where SR is the second value of the slew rate and $SR_{max}$ is a maximum slew rate allowed for the MRI system.

12. A method for supplying current to a gradient coil of a magnetic resonance imaging system by a gradient amplifier comprising a bridge switching power stage, the method comprising:

supplying, by an electrical power supply, a voltage over the bridge switching power stage at first level to the gradient amplifier output to generate a gradient current in the gradient coil to produce a magnetic gradient field at a slew rate, wherein the slew rate is set to a first value, resetting the slew rate to a second value by operations including:

determining electrical power dissipated by the gradient coil currently producing the magnetic gradient field by multiplying a square of the current in the gradient coil by a resistance of a winding of the gradient coil; and selecting the second value of the slew rate from one or more predetermined slew rate values, if the dissipated electrical power exceeds a predetermined maximum allowed dissipation value;

comparing the second value to the first value, and adjusting the voltage over the bridge switching power stage to a second level if the second value is different from the first value.

13. The method of claim 12, wherein the second value is below the first value and the voltage at second level is smaller than the voltage at first level.

14. The method of claim 13, wherein the voltage at second level $V_2$ is determined from the voltage at first level $V_1$ using the equation:

$$V_2 = S \times V_1, \text{ where } S = \max(SR/SR_{max}, 0.5)$$

where SR is the second value of the slew rate and $SR_{max}$ is a maximum slew rate value allowed for the MRI system.

* * * * *